US011675108B2

(12) United States Patent
Williams

(10) Patent No.: US 11,675,108 B2
(45) Date of Patent: Jun. 13, 2023

(54) HIGH PERFORMANCE COLOUR CORRECTIVE ANTI-REFLECTION COATING FOR VISIBLE WAVELENGTH OPTICAL ELEMENTS

(71) Applicant: Qioptiq Limited, St. Asaph (GB)

(72) Inventor: Jonathan Williams, Bagillt (GB)

(73) Assignee: Qioptiq Limited, St. Asaph (GB)

(*) Notice: Subject to any disclaimer, the term of this patent is extended or adjusted under 35 U.S.C. 154(b) by 461 days.

(21) Appl. No.: 16/797,324

(22) Filed: Feb. 21, 2020

(65) Prior Publication Data

US 2020/0284949 A1    Sep. 10, 2020

(30) Foreign Application Priority Data

Mar. 6, 2019 (EP) .................................. 19160991

(51) Int. Cl.
*G02B 1/115* (2015.01)
*C23C 14/06* (2006.01)
(Continued)

(52) U.S. Cl.
CPC .......... *G02B 1/115* (2013.01); *C03C 17/3417* (2013.01); *C03C 17/3429* (2013.01);
(Continued)

(58) Field of Classification Search
CPC ........ G02B 1/115; G02B 5/208; G02B 5/288; G02B 1/00; G02B 1/10; G02B 1/111; G02B 1/11; G02B 1/113; G02B 5/0816; G02B 5/0825; G02B 5/0833; G02B 5/0841; G02B 5/20; G02B 5/28; G02B 5/282;
(Continued)

(56) References Cited

U.S. PATENT DOCUMENTS 6,307,671 B1   10/2001  Yabuki
2004/0239251 A1  12/2004  D Haene et al.

FOREIGN PATENT DOCUMENTS

CN   107505668 A  * 12/2017
EP   1189078         3/2002
EP   1275986 A2  *  1/2003  ............. G02B 1/111

OTHER PUBLICATIONS

Communication pursuant to Article 94(3) EPC dated Aug. 1, 2022 for European Application No. 19160991.6.
European Search Report for EP19160991 completed Aug. 28, 2019.

* cited by examiner

*Primary Examiner* — Arnel C Lavarias
(74) *Attorney, Agent, or Firm* — Wolf, Greenfield & Sacks, P.C.

(57) ABSTRACT

An optical element (200), has a first surface configured to convey light, a second surface configured to convey light, an optical path between the first surface and the second surface, a filter coating (230) applied to the first surface, and a colour corrected anti-reflection (AR) coating (240) with colour correcting and antireflection characteristics applied to the second surface. The AR coating is configured according to an antireflective function to maximise photopic transmission and/or, integrated visual photopic transmission (IVPT) of the optical path. The second surface is disposed opposite the first surface, and the antireflective function is determined according to a daylight emission a $I(\lambda)$, a transmission spectrum of the antireflection/colour corrective coating $T(\lambda)$ and a thickness a $d(\lambda)$, of the film for a specified wavelength.

19 Claims, 17 Drawing Sheets

(51) Int. Cl.
    *C23C 14/08*         (2006.01)
    *C23C 14/30*         (2006.01)
    *C23C 14/35*         (2006.01)
    *C23C 14/48*         (2006.01)
    *G02B 5/20*          (2006.01)
    *C03C 17/34*         (2006.01)
    *G02B 5/28*          (2006.01)

(52) U.S. Cl.
    CPC ........ *C23C 14/0629* (2013.01); *C23C 14/083* (2013.01); *C23C 14/30* (2013.01); *C23C 14/35* (2013.01); *C23C 14/48* (2013.01); *G02B 5/208* (2013.01); *G02B 5/288* (2013.01)

(58) Field of Classification Search
    CPC ........ G02B 5/285; G02B 5/286; G02B 5/287; G02B 5/289; C03C 17/3417; C03C 17/3429; C23C 14/0629; C23C 14/083; C23C 14/30
    USPC ....... 359/588, 577, 580, 581, 584, 586, 589, 359/590
    See application file for complete search history.

HIGH PERFORMANCE COLOUR CORRECTIVE ANTI-REFLECTION COATING FOR VISIBLE WAVELENGTH OPTICAL ELEMENTS

CROSS REFERENCE TO RELATED APPLICATIONS

This application claims the benefit of and priority to European patent application serial number 19160991.6, filed Mar. 6, 2019, entitled "High Performance Colour Corrective Anti-Reflection Coating For Visible Wavelength Optical Elements," which is incorporated by reference herein in its entirety.

FIELD OF THE INVENTION

The present invention relates to optical elements, and more particularly, is related to a coating for an optical element.

BACKGROUND OF THE INVENTION

Coatings for an optical component, for example, a lens, a filter, among others, may be applied to the optical component to augment the functionality of the optical component, and/or to correct a deficiency of the optical component in a specific application. For example, it may be desirable to apply an anti-reflective coating to an optical component, or to apply a colour corrective coating to the optical component. Typically, a first substrate surface of an optical component may have a filter coating, and a second substrate surface of the optical component may have an anti-reflective (AR) coating. However, such approaches generally do not address desired colour neutrality aspects of the optical component. Therefore, it is desirable to address the above-mentioned shortcomings.

SUMMARY OF THE INVENTION

Embodiments of the present invention provide high performance colour corrective anti-reflection coating for visible wavelength optical elements. Briefly described, the present invention is directed to an optical element having a first surface configured to convey light, a second surface configured to convey light, an optical path between the first surface and the second surface, a filter coating applied to the first surface, and a colour corrected anti-reflection (AR) coating with colour correcting and anti-reflection characteristics applied to the second surface. The AR coating is configured according to an anti-reflective function to maximise photopic transmission and/or, integrated visual photopic transmission (IVPT) of the optical path. The second surface is disposed opposite the first surface, and the anti-reflective function is determined according to a daylight emission a I($\lambda$), a transmission spectrum of the antireflection/colour corrective coating T($\lambda$) and a thickness a d($\lambda$), of the film for a specified wavelength.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

DETAILED DESCRIPTION

Figure 1B:
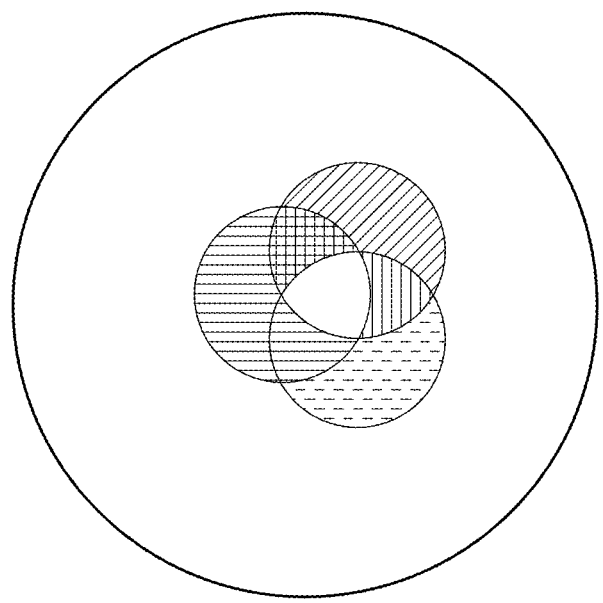
FIG. 1B is a photograph of a minus green element optical element with colour corrective antireflection coating.

The following definitions are useful for interpreting terms applied to features of the embodiments disclosed herein, and are meant only to define elements within the disclosure.

As used within this disclosure, "optical element" refers to an electromagnetic radiation conveying material configured to receive electromagnetic radiation at an ingress surface and to emit electromagnetic radiation at an egress surface. Examples of an optical element include a lens, a filter, dichroic glass, a waveguide, and an optical fiber, among others.

As used within this disclosure, "coating" refers to one or more layers of a material applied to an optical element. Coating may refer to solid overlay, or to a liquid or spray-on coating.

As used within this disclosure "glass air boundary" refers to a location where a surface of an optical element meets an optical medium. It is not intended to limit the material of the optical element to be glass, or to limit the optical medium to be air. This term is equivalent to "substrate/air boundary," or "substrate of an optical element" where "substrate" refers to an interface surface of the optical element with the optical medium.

Reference will now be made in detail to embodiments of the present invention, examples of which are illustrated in the accompanying drawings. Wherever possible, the same reference numbers are used in the drawings and the description to refer to the same or like parts.

Embodiments of the present invention include a coating, for example, an optical thin-film coating of one or more layers for an optical component, configured to perform as both an antireflection coating, and a colour corrective coating, for example, for selective minus colour wavelength notch filters nominally centered between 520 nm and 580 nm. The embodiments may therefore be used to replace a single function antireflection coating.

Specifically the embodiments perform the following two functions:

1) an antireflection coating, is configured to minimise optical losses at a glass air boundary. Typically for a 1.52 refractive index optical element, this loss is in the order of 4.2%. In order to minimise secondary images associated with specific light sources (emission spectra), the maximum reflectivity loss at the substrate/air boundary is preferably less than 0.5% R, preferably at least over incident angles 0° to 30°, and 2) a colour corrective coating. For example, a minus green notch reflector, which is consequentially purple in transmission by the addition of said notch reflector, can be rebalanced by correcting the tri-stimulus function to normalise perceived colour vision (returning the outside world purple colouration to a neutral state).

Figure 1A:
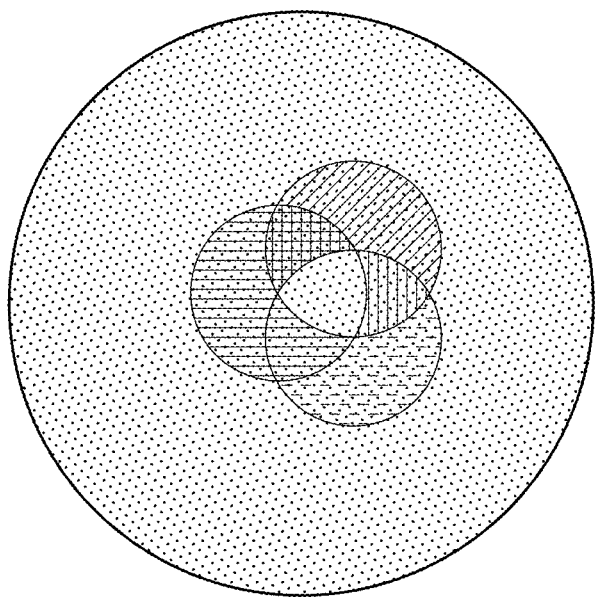
FIG. 1A is a photograph of a prior art minus green element optical element standard antireflection coating.

The coating selectively cuts out specific wavelengths of the photopic spectrum, which for a minus green notch filter centered at approximately 530 nm for example, includes wavelengths below 440 nm and wavelengths above 660 nm, restoring colour neutrality. Concurrently, in order to maintain as high as possible transmission through the optic as possible, the reflection loss between the said wavelengths is preferably less than 0.5% average (or better). FIG. 1A shows a standard antireflective coating, while FIG. 1B shows a colour corrective antireflective coating.

For the thin-film coating of the embodiments, a Fourier transform function of the combined antireflection/colour corrective design adjusts the tri-stimulus balance (the human eyes ability to perceive colour). Calculation of the colour co-ordinates can be established using Tristimulus calculations $$X = \int_0^\infty I(\lambda)T(\lambda)\bar{x}(\lambda)d\lambda \quad \text{(Eq. 1)}$$

$$Y = \int_0^\infty I(\lambda)T(\lambda)\bar{y}(\lambda)d\lambda \quad \text{(Eq. 2)}$$

$$Z = \int_0^\infty I(\lambda)T(\lambda)\bar{z}(\lambda)d\lambda \quad \text{(Eq. 3)}$$

where $I(\lambda)$ is daylight emission, $T(\lambda)$ is the transmission spectrum of the antireflection/colour corrective coating in combination with the filter to correct, $\bar{x}, \bar{y}, \bar{z}(\lambda)$ are the colour matching functions that describe the response of the observer, and $d(\lambda)$ is the thickness of the film for any given wavelength. This may be translated into x-y co-ordinates using $$x = \frac{X}{X+Y+Z} \quad \text{(Eq. 4)}$$

$$y = \frac{Y}{X+Y+Z} \quad \text{(Eq. 5)}$$

To apply colour correction to the antireflection coating under the embodiments, an antireflective function to maximise photopic transmission (or IVPT, integrated visual photopic transmission) is determined. Calculation of IVPT is established using $$IVPT = \frac{\int_0^\infty I(\lambda)V(\lambda)T(\lambda)d\lambda}{\int_0^\infty I(\lambda)V(\lambda)d\lambda} \quad \text{(Eq. 6)}$$

functions as above, where V is the photopic response of the human eye.

Figure 11A:
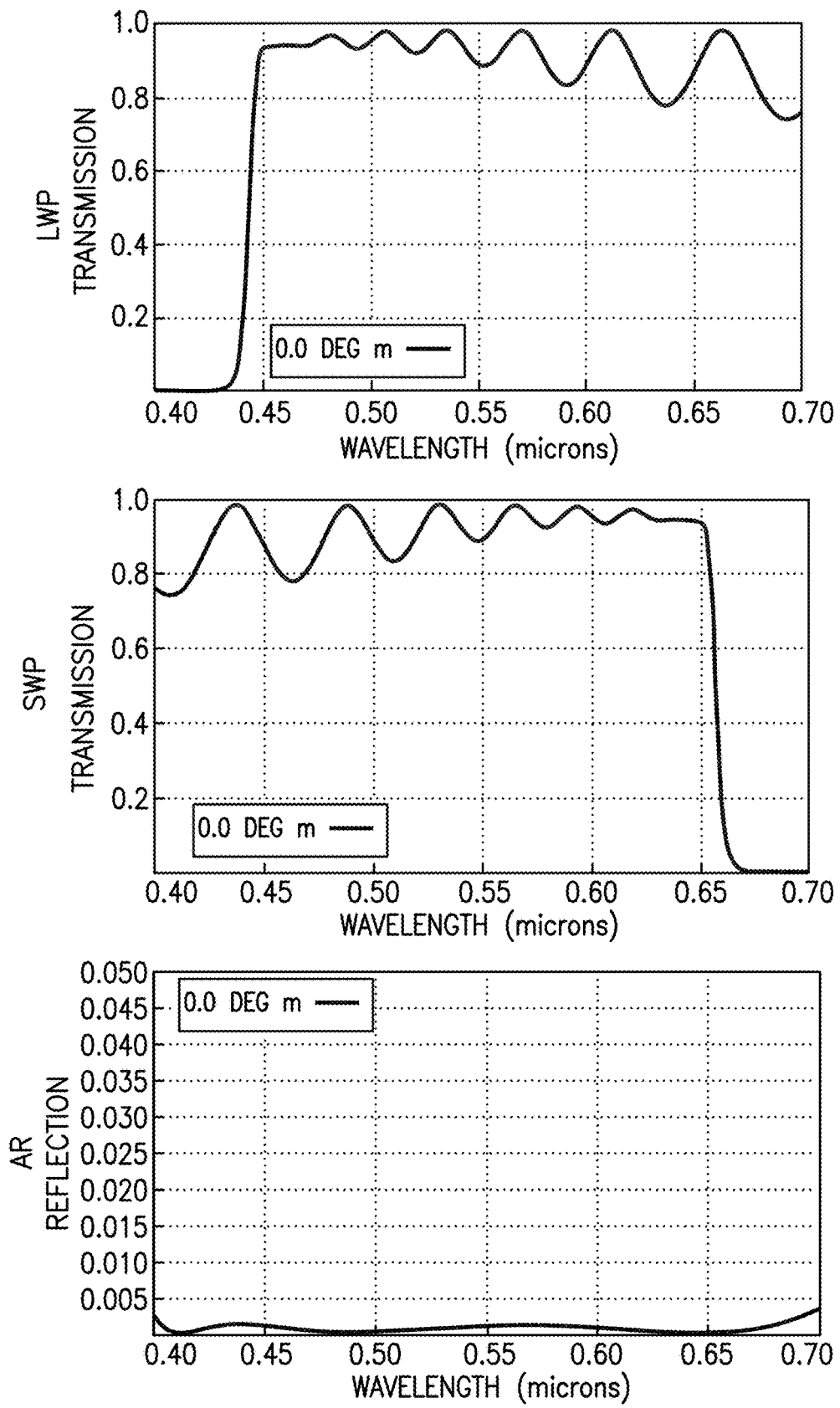
FIG. 11A shows graphs depicting a broad bandpass filter applied to the second surface of a notch filter coating, where the cut-on, and cut off edges determine the levels of colouration.
Figure 11B:
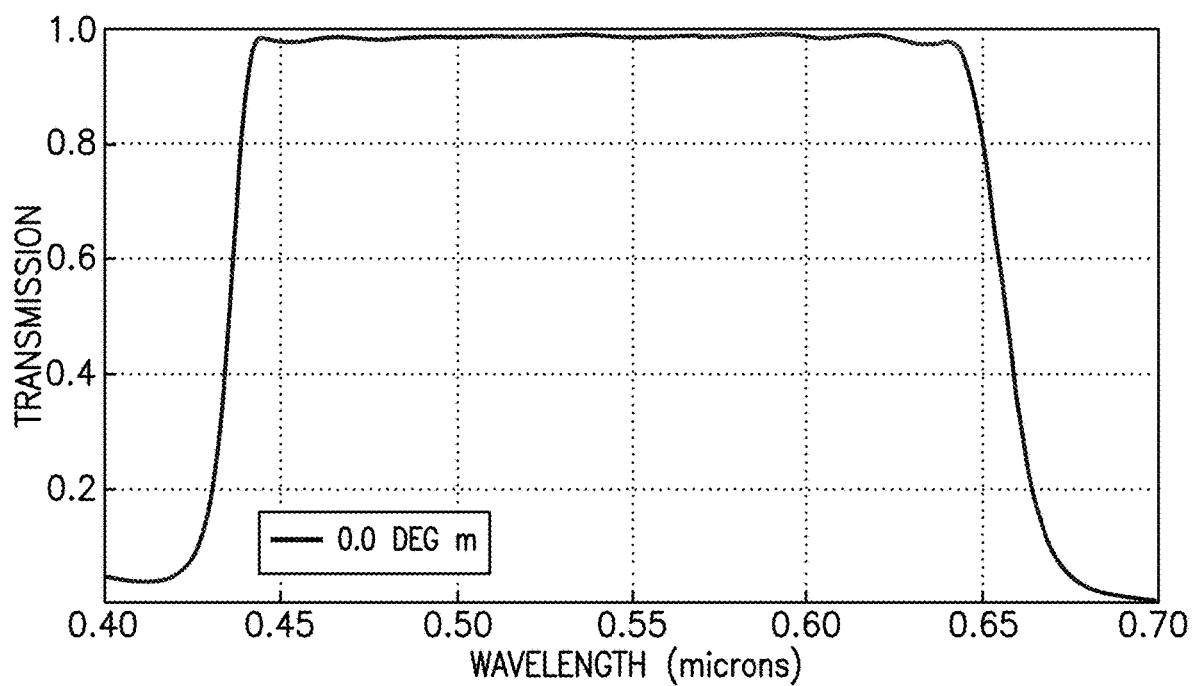
FIG. 11B shows graph depicting the combined functionality of the graphs shown in FIG. 11A.

For a single colour optimised antireflection coating, a range of notch filter dichroics incorporates a notch, for example, preferably between a specific wavelength range of approximately 500 nm to 580 nm. General purpose antireflection coatings are used to increase the 'outside-world' transmission through the optical element but not the colour correction function, wherein the embodiments combine the two sets of functionality into a single use device. In essence, the antireflection properties are incorporated, in addition to, a broad bandpass filter, where the cut-on, and cut off edges (440 nm±10 nm for the cut on (as shown in the LWP transmission graph of FIG. 11A), and 660 nm±10 nm for the cut off (as shown in the SWP transmission graph of FIG. 11A) determine the levels of colouration. Typically, the antireflection function (as shown in the AR graph of FIG. 11A), needs to provide less than 0.5% reflection loss across the photopic spectrum, maximising transmission. All of these utilities are met within a singular device that can be applied to the second surface of a notch filter coating. The combined functionality is shown in FIG. 11B. This combination allows for applicability to existing filter designs, for example to provide colour neutrality.

Figure 2A:
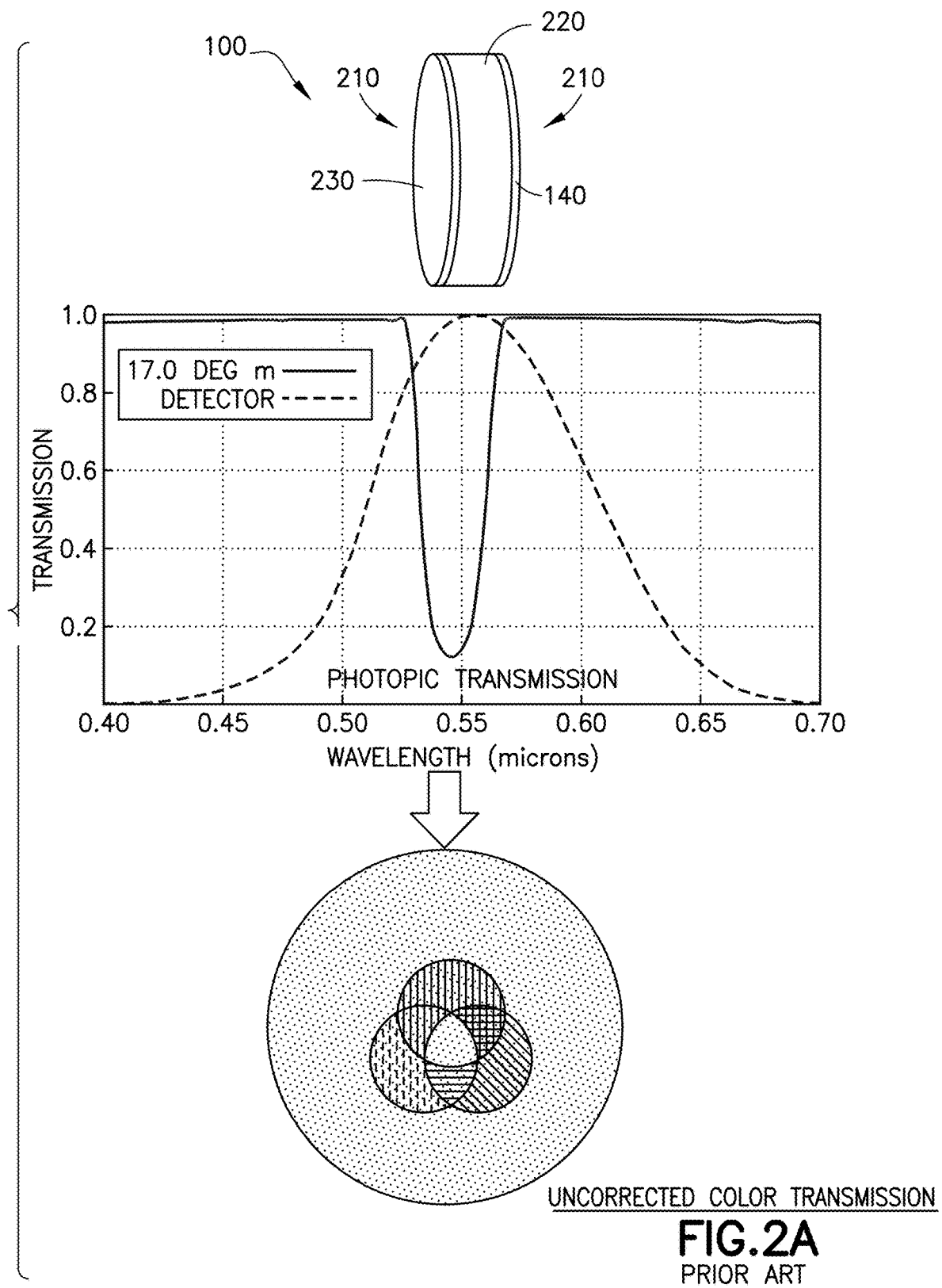
FIG. 2A shows an exemplary structure and transmission graph of the prior art filter of FIG. 1A.

As shown by FIG. 2A, an exemplary prior art filter 100 includes an optical element 220, a dichroic or Rugate filter coating 230 applied to a first face of the optical element 220, and a standard AR coating 140 applied to a second face of the optical element 220, opposite the first face. The prior art filter 100 relies on the optical coupling of the filter 230 to the antireflection coating 140, via a substrate medium of an optical element 220, for example, but not limited to 1.52 n BK7 type mineral glass. The transmission order may be described as air 210/filter 230/glass 220/AR coating 140/Air 210. The exemplary prior art filter 100 on its own gives a strong purple outside world transmission.

Figure 2B:
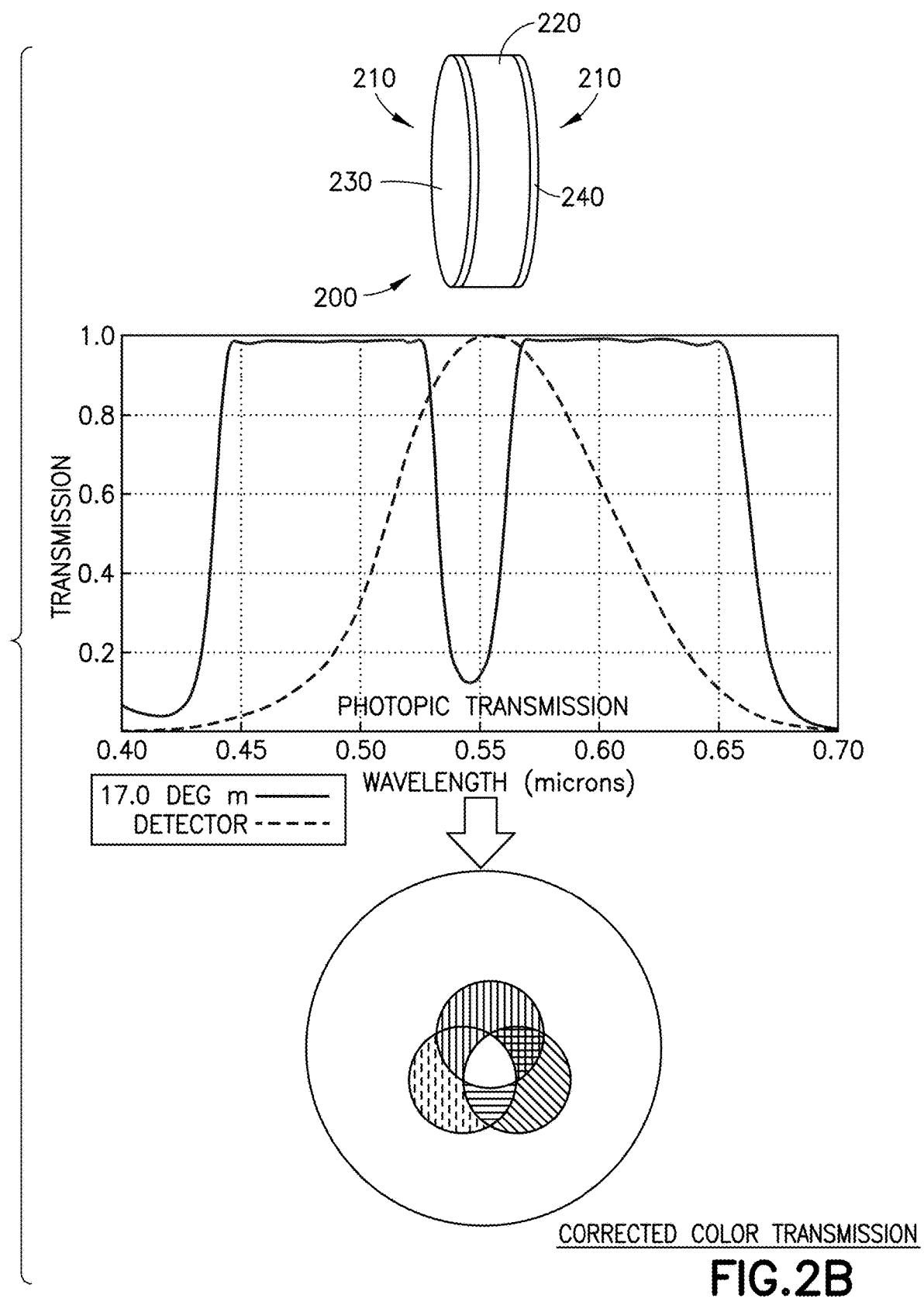
FIG. 2B is a schematic drawing of an exemplary structure and transmission graph of the first embodiment filter of FIG. 1B.

As shown by FIG. 2B, an exemplary first embodiment filter 200 includes the optical element 220, the dichroic or Rugate filter coating 230 applied to the first face of the optical element 220, and a colour corrected AR coating 240 applied to the second face of the optical element 220. The transmission order may be described as air 210/filter 230/glass 220/colour corrected AR 240/Air 210. The colour corrective antireflection coating 240 on its own has a strong greenish/yellow outside world transmission. When the colour corrective AR is applied to the opposing face to the filter coating, the through transmission is colour corrected. It should be noted that once the filter coating and AR coatings have been applied the device will correct colour for light from either the dichroic/Rugate filler coating side 230 or the AR coating side 240.

As shown by comparing the photopic transmission graphs of FIG. 2A and FIG. 2B, omitting the short and/or long cut on/cut off edges of the dichroic filter 200 (as in the graph of FIG. 2A) or not wavelength centering the filter correctly, then the colour correction is not achieved. In general, the wavelength centering of the short edge is preferably 440 nm±10 nm, and the centering of the long edge 660±10 nm, for optical notch filters centering between 500 nm and 580 nm. However, the level of neutrality depends upon the characteristic of the filter being remedied, in terms of its waveband, reflectance and wavelength centering. The colour neutrality is solely provided by the antireflection coating 240.

Figure 3:
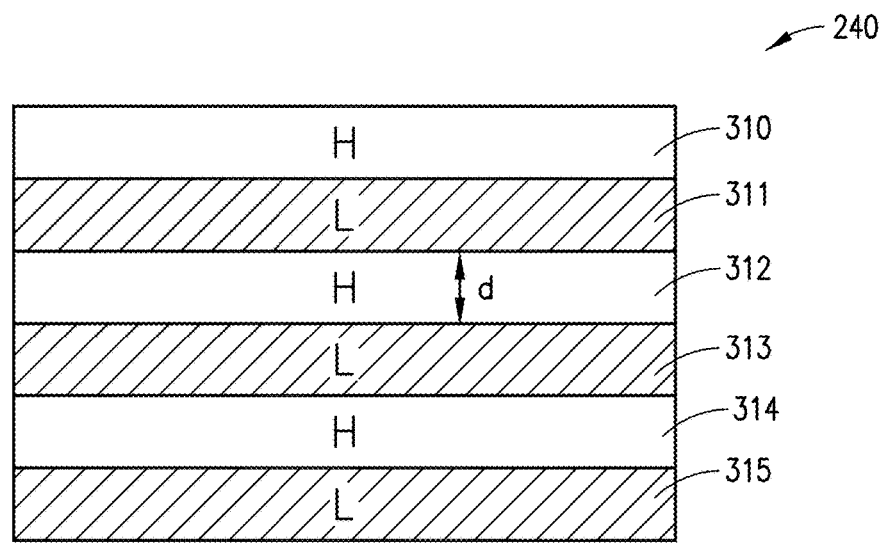
FIG. 3 is a schematic diagram showing a representation of a high/low thin film coating.

The colour corrected AR coating 240 is fabricated using alternating layers of high and low index coating materials, some of the high index materials used in the device may include but is not limited to $TiO_2$, $Ti_3O_5$, $Ta_2O_5$, ZnS, and/or a mixture containing one or more of these. Some of the low index materials used may include but is not limited to $SiO_2$, $Al_2O_3$, $YbF_3$, $YF_3$, and/or a mixture containing one or more of these. In order to optimise the efficiency of the coating design, the greater the value of the index ratio, the fewer number of layers are required to achieve a given level of spectral performance. For the colour corrective coating, a minimum high index value of around 2.0 would be required, with an ideal index of around 2.5. Whereas a maximum low index value of around 1.5 would be usable, with a preferable index of around 1.4. The thin film coating may be evaporated using various PVD techniques (physical vapour deposition), these may include Electron beam evaporation, Magnetron Sputtering, and Ion Beam Deposition. P.I.A.D (Plasma Ion Assisted Deposition) or any other methods of evaporation may also be employed to densify said materials with referred evaporation techniques. Thermal deposition processes can also be employed at temperatures above 250° C. and below 320° C. The optical thin film will typically be between 1.5 μm and 3.0 μm in physical thickness. FIG. 3 shows a representation of a HL thin film coating, where d represents the physical thickness of an individual layer. While FIG. 3 shows six layers (three low index layers 311, 313, 315 and three high index layers 310, 312, 314), in other embodiments there may be more or fewer layers.

The number of layers may vary depending on the requirements of a particular application, for example, between a single layer and 50 layers. For example, many single layer quarter wave optical thickness low index AR coatings are commercially used. In general, fewer layers are considered more desirable, as they are easier to manufacture, and are less subjectable to random and systematic manufacturing errors. The number of layers is dictated by the device performance and the amount of reflectivity required, for example, with angle of incidence or various polarisation states.

The alternation of the layers is generally HL in structure, although in some embodiments a third material may be used, for example HLMLHLML, where M refers as an intermediate layer between the H and L layers. With antireflection coatings it is important that the light from the air side hits a low reflective index layer first, as the light couples into the coated film.

The colour corrective AR coating 240 generally uses the second surface of the substrate, normally associated purely with an antireflective coating requirement, to combine this function with colour correction. Instead of individually balancing the notch design specifically for colour neutrality, the colour corrective AR coating 240 uses generic cut off/cut on bands at approximately 440 nm and 660 nm significantly reducing parts of the visual tristimulus, thus performing generic colour correction for notch filter types between approximately 500 nm and up to 580 nm depending of the breath, wavelength centering, and reflectance level of the filter. The colour corrective AR coating 240 allows colour correction of already established processes, without the need to re-design the filter device.

Figure 4:
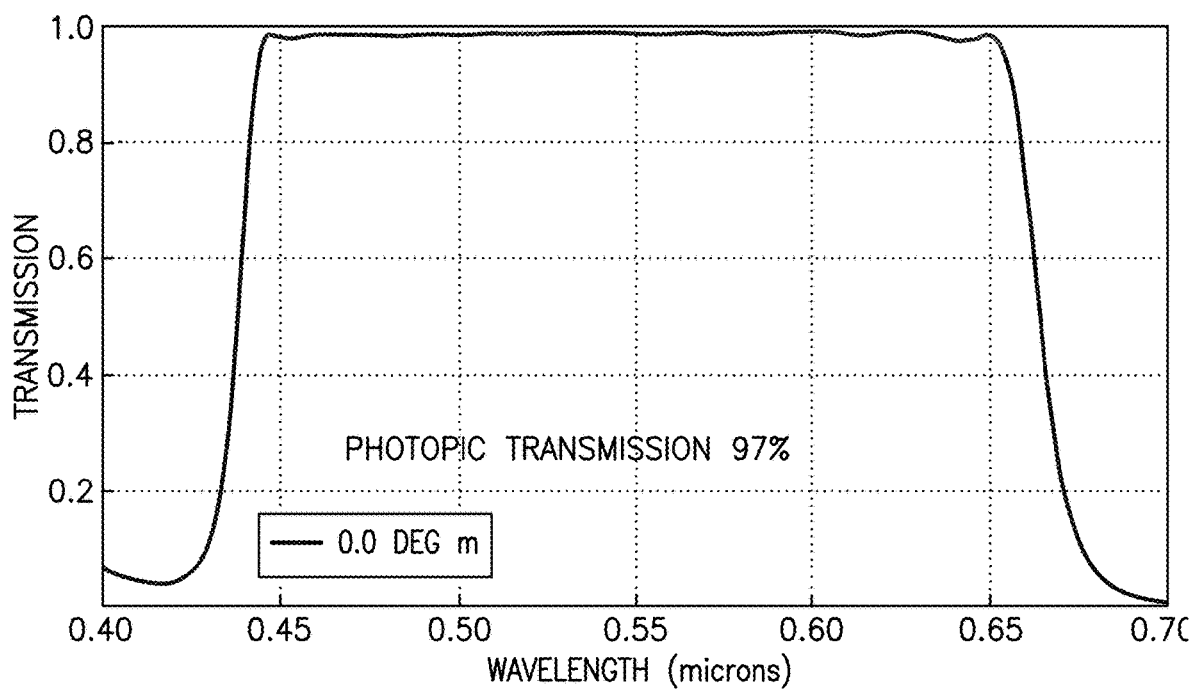
FIG. 4 is a graph plotting an exemplary transmission of the colour corrective AR coating.
Figure 5:
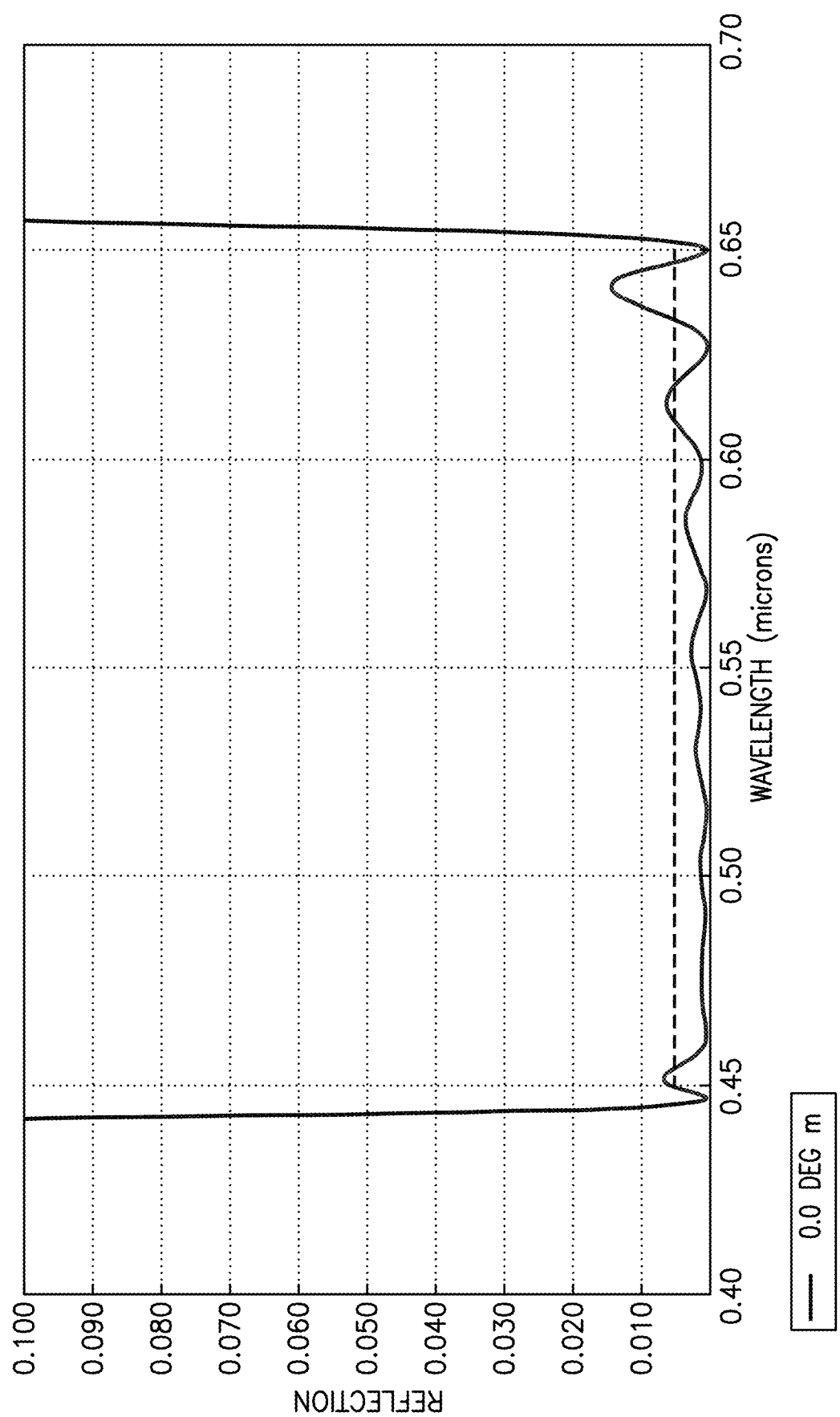
FIG. 5 is a graph plotting reflectance of the colour corrective AR coating.

FIG. 4 shows a plot of wavelength transmission for an exemplary optical device coating under the first embodiment having a short edge cut on at 440 nm, and a long edge cut off at 660 nm. FIG. 5 shows the antireflection properties of the exemplary optical device coating, typically below 0.5% reflectance is required from a single surface of 1.52 nd, between 450 nm and 650 nm. This particular filter has an average reflectance of 0.2% over the waveband.

Figure 6:
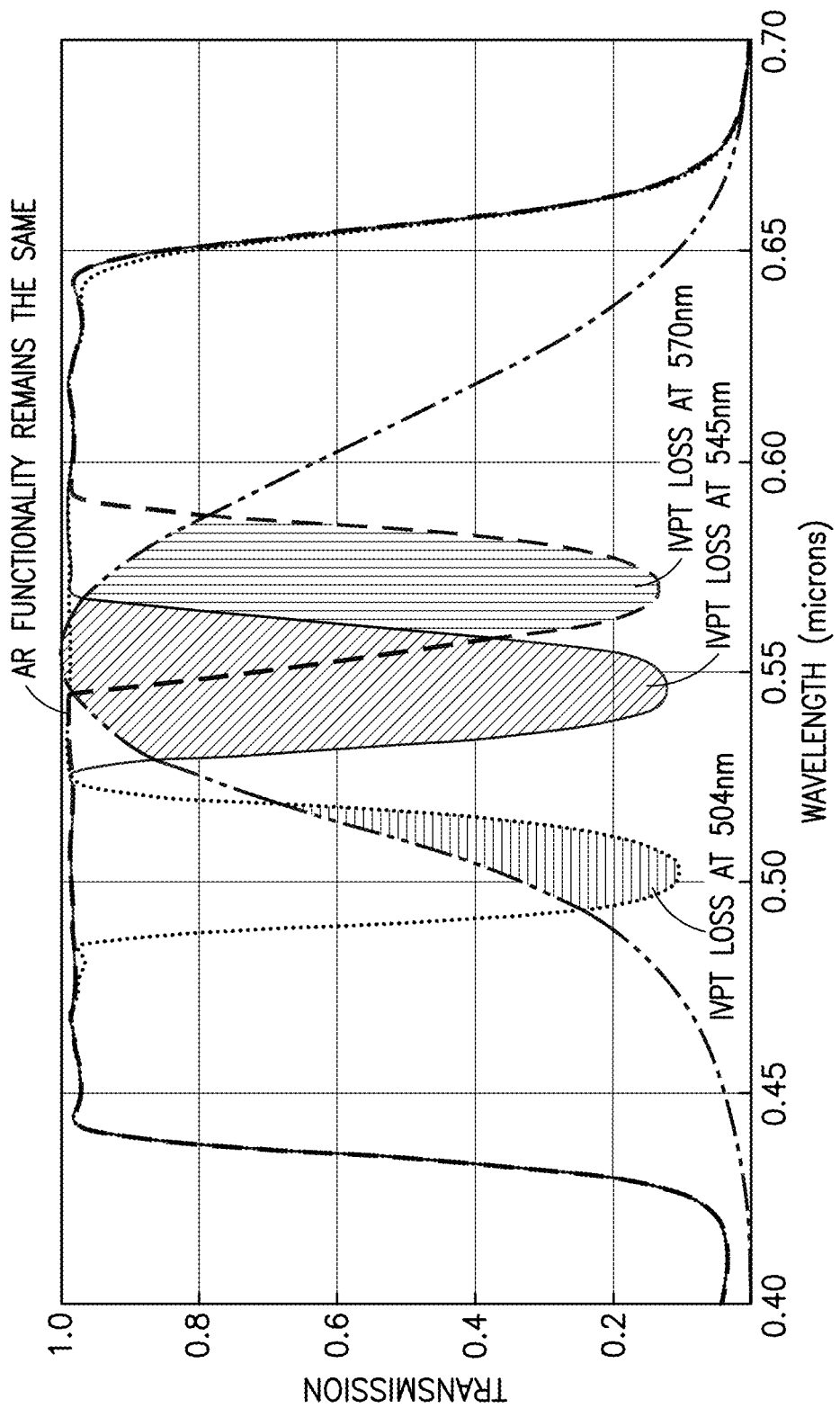
FIG. 6 is a graph plotting the effect on IVPT on moving the filter wavelength.
Figure 7A:
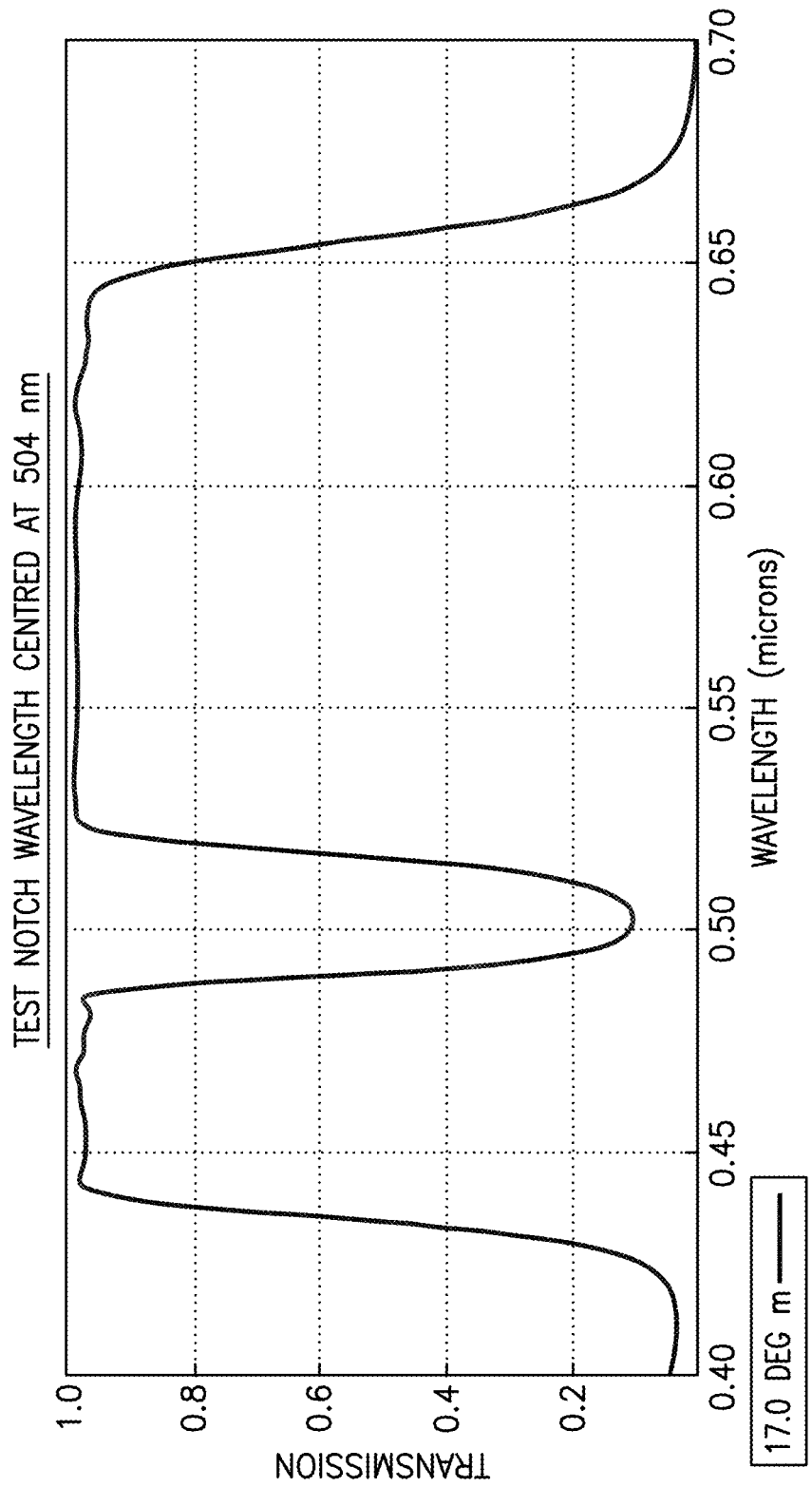
FIG. 7A is a graph showing effects of colour corrective AR performance with filter wavelength shift for a test notch wavelength centered at 504 nm.
Figure 7B:
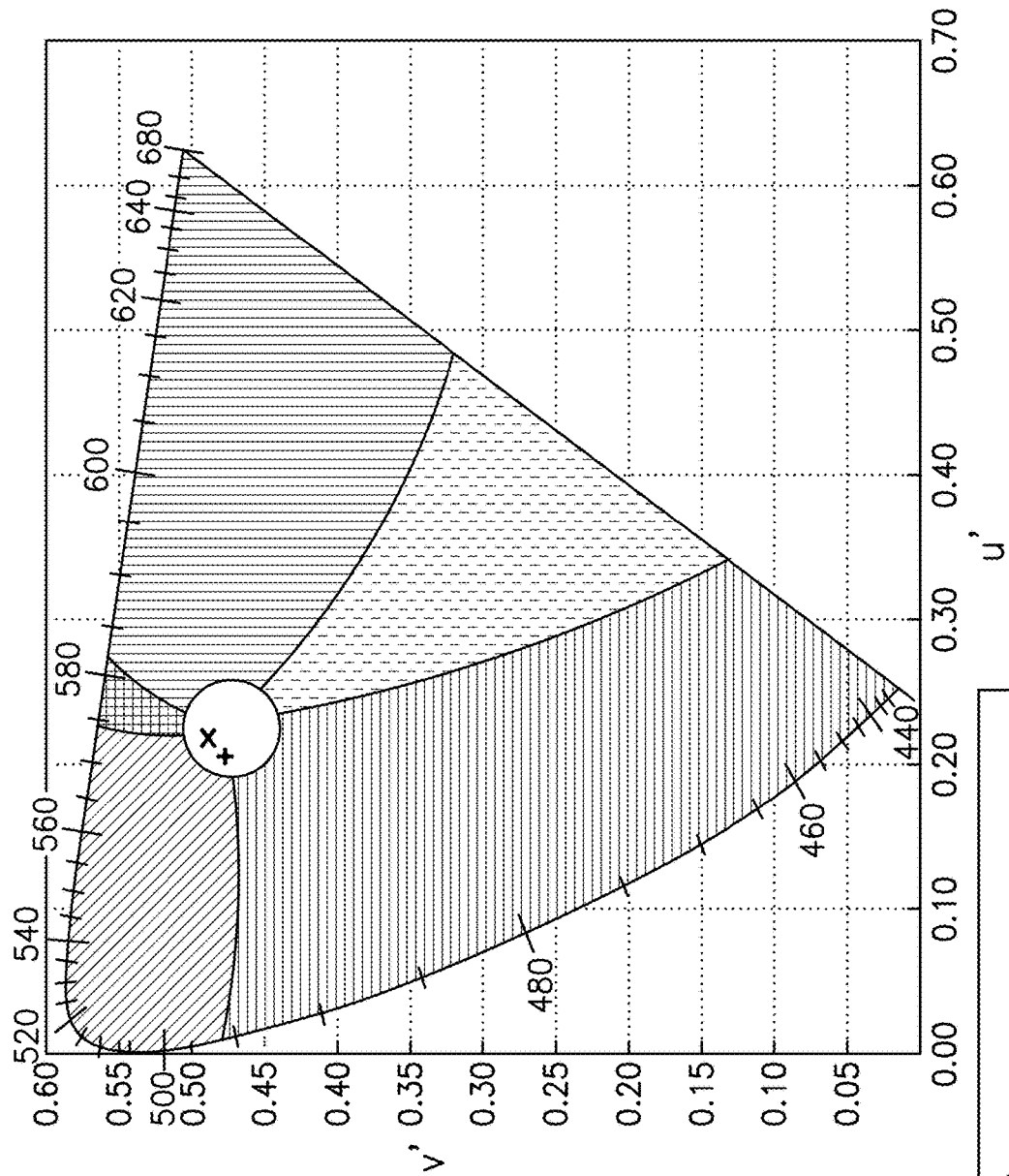
FIG. 7B plots the effects of colour corrective AR performance with filter wavelength shift for a test notch wavelength centered at 504 nm.
Figure 7C:
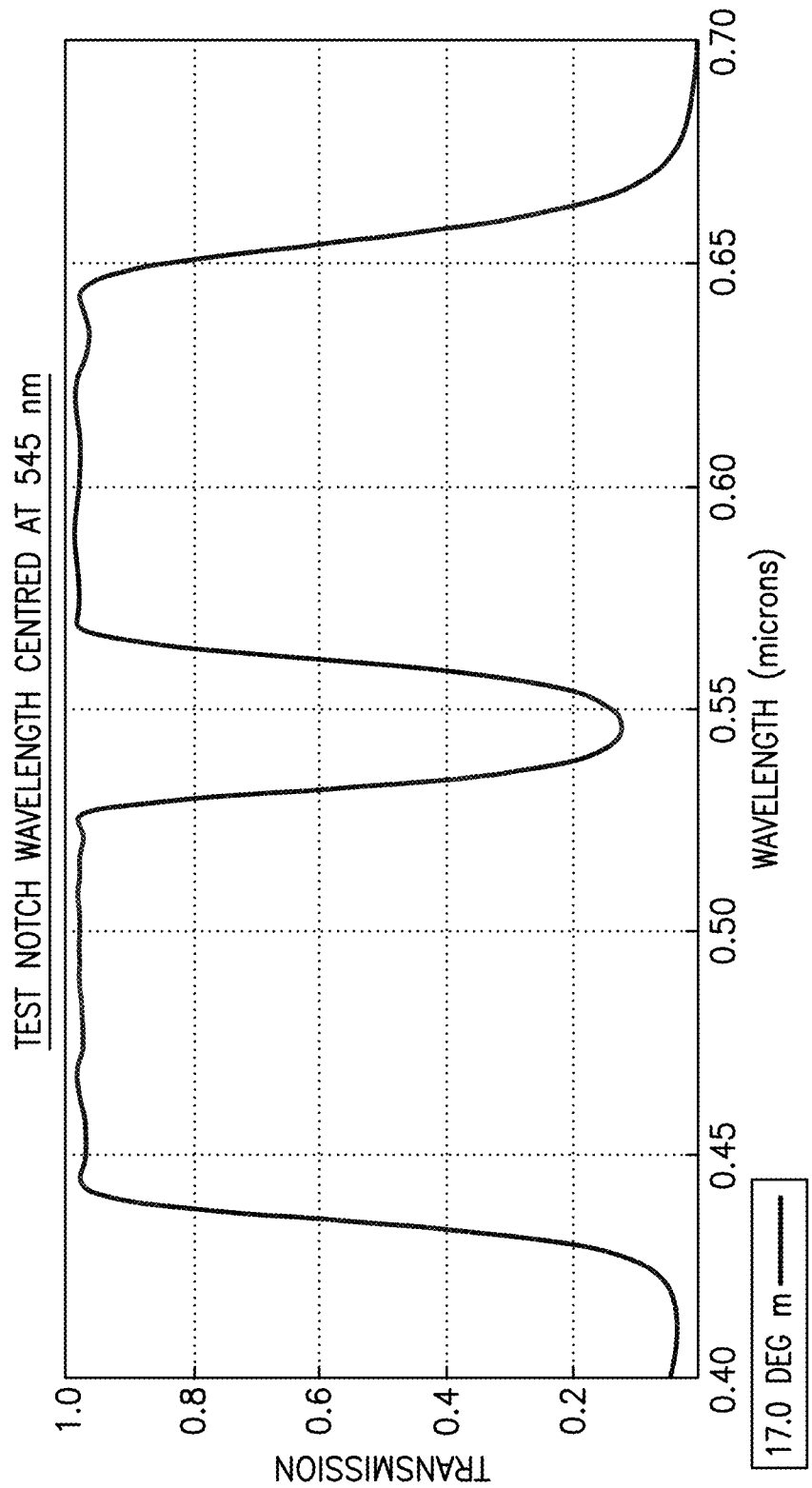
FIG. 7C is a graph showing effects of colour corrective AR performance with filter wavelength shift for a test notch wavelength centered at 545 nm.
Figure 7D:
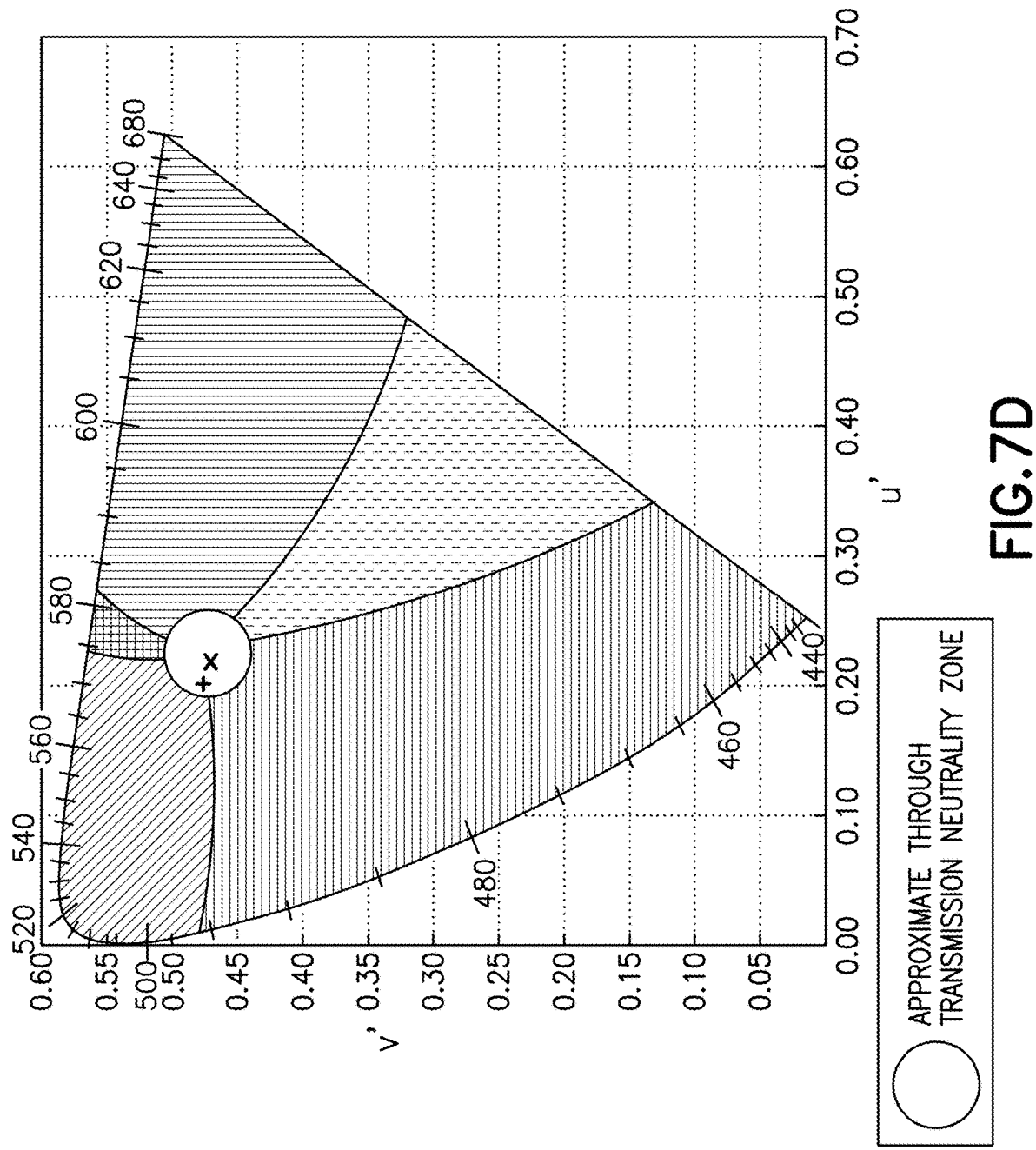
FIG. 7D plots the effects of colour corrective AR performance with filter wavelength shift for a test notch wavelength centered at 545 nm.
Figure 7E:
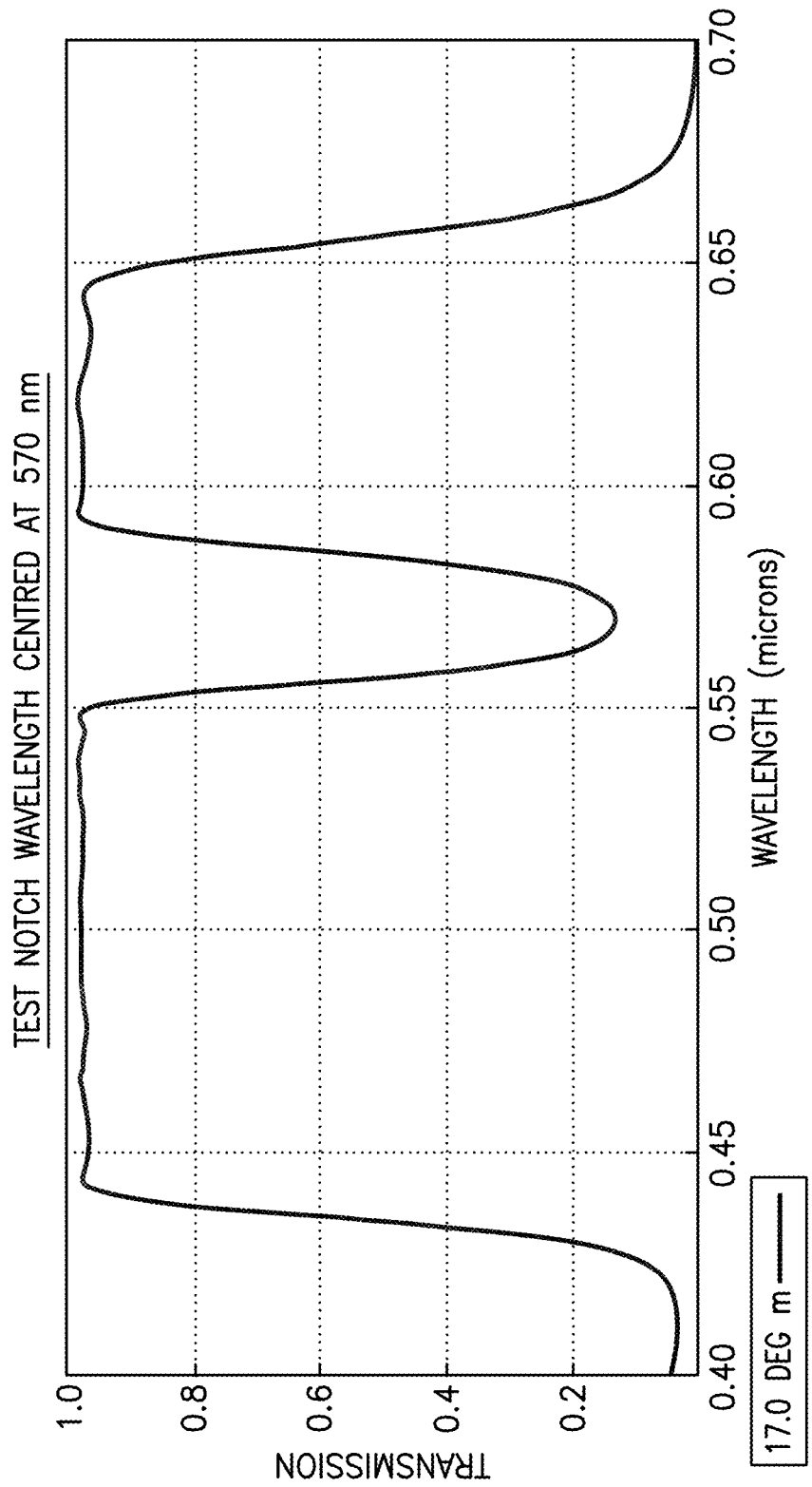
FIG. 7E is a graph showing effects of colour corrective AR performance with filter wavelength shift for a test notch wavelength centered at 570 nm.
Figure 7F:
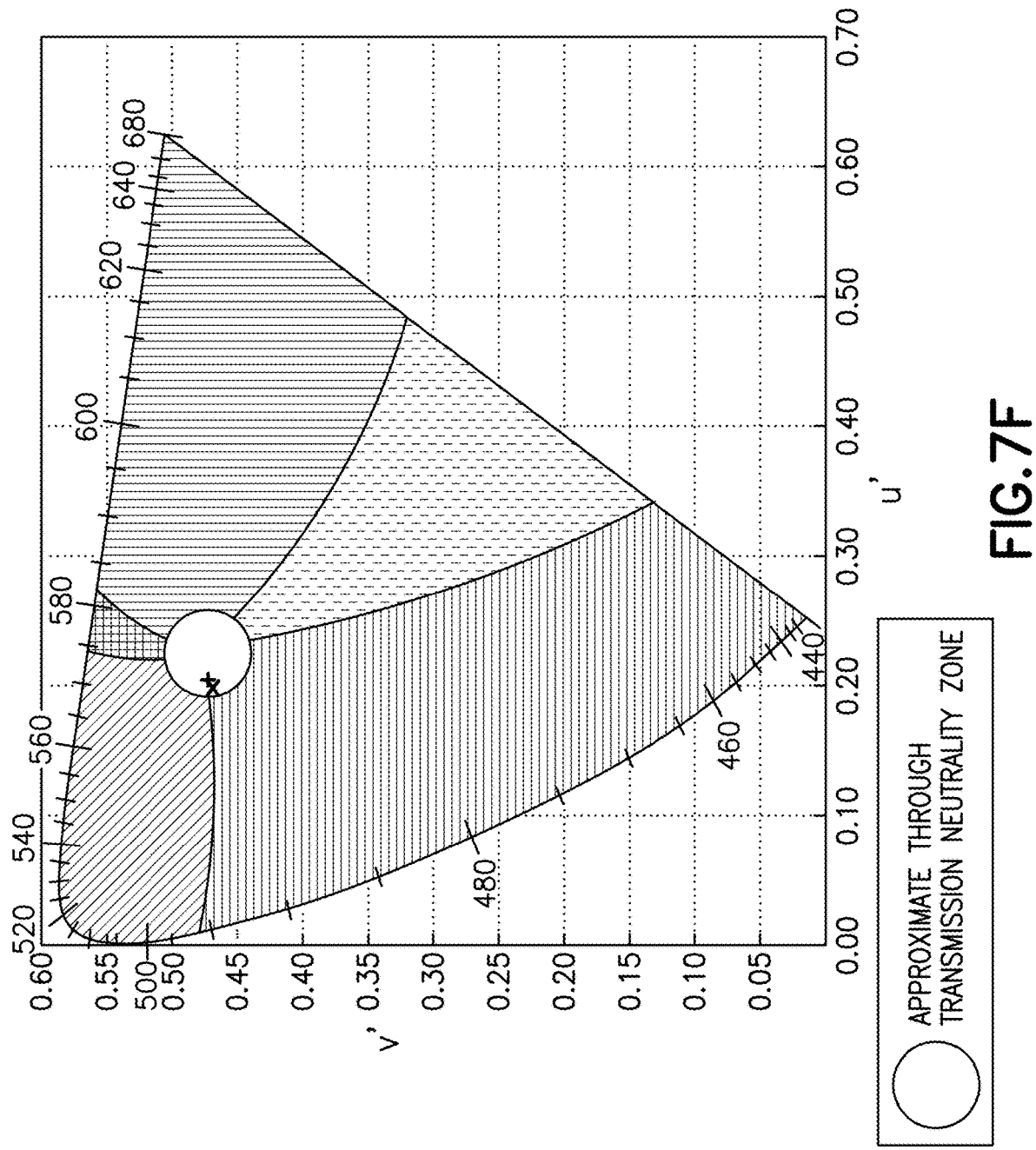
FIG. 7F plots the effects of colour corrective AR performance with filter wavelength shift for a test notch wavelength centered at 570 nm.

IVPT (integrated visual photopic transmission) is altered with varying wavelength centering of the reflective notch. This is a function of the filter, and not the AR application of the optical device. FIG. 6 shows in that in most practical applications, where the colour correction is most efficient, the greatest loss in photopic transmission occurs. Any movement away from the center of the photopic curve results in an increase in IVPT. FIGS. 7A-7F show the colour corrective AR in combination with a green notch reflector coating. For the filter demonstrated in FIGS. 7A-7F, colour correction is gained from 504 nm to 570 nm without any changes to the cut-on and cut-off wavelengths of the optical device.

While some degree of colour correction could be obtained by the addition of reflective notches combined with the notch filter coating on a single surface of a substrate. However, in order to meet desirable performance requirements, such filter would be very complex to fabricate, and the additional colour balance would only be relevant for that particular filter being manufactured.

Figure 9:
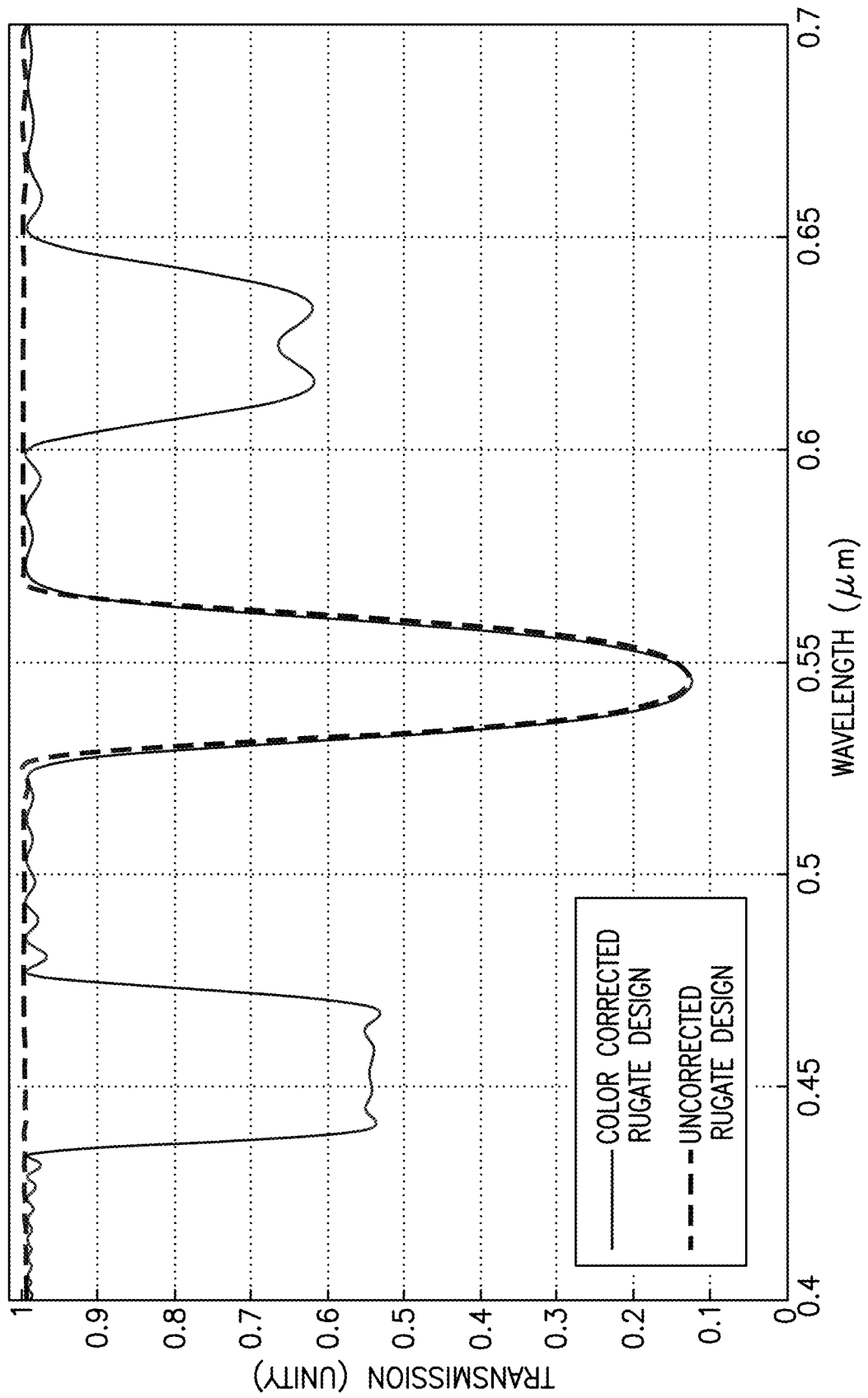
FIG. 9 is a graph showing an example of a single surface colour corrected notch.

By contrast, as the colour corrective coating operates on the antireflection coated surface of an optical element, the device can accommodate a series of notch filters, where the center wavelength of the notch sits between 504 nm and 570 nm (and give some form of colour correction). Whilst the application of the coating of the embodiments is more involved than that of a standard AR coating, the fabrication of such a device is far less complex than the manufacture of a Rugate based design (as shown in FIG. 9.). The Rugate design also has to be tailored to the notch wavelength in question, and would not have the flexibility to operate over a broader wavelength range, as experienced with the colour corrective AR application.

The embodiments may be less effective in some circumstances. For example, when the wavelength centering of the notch filter falls above, or below, the effective correction provided by the cut on and cut off edges of the device, and subsequent changes to the cut on and cut off edges cannot recover the colour neutrality. In essence, if a notch filter is too 'blue' or too 'red' in reflectance, some form of green' reflection would be required, which negates the claims for the colour corrective AR dual functionality. Similarly, the embodiments may not perform effectively as a stand-alone colour corrective filter. Finally, the embodiments may be ineffective if applied to long pass or short pass filter, where either side of the pass band is optically blocked.

Figure 8:
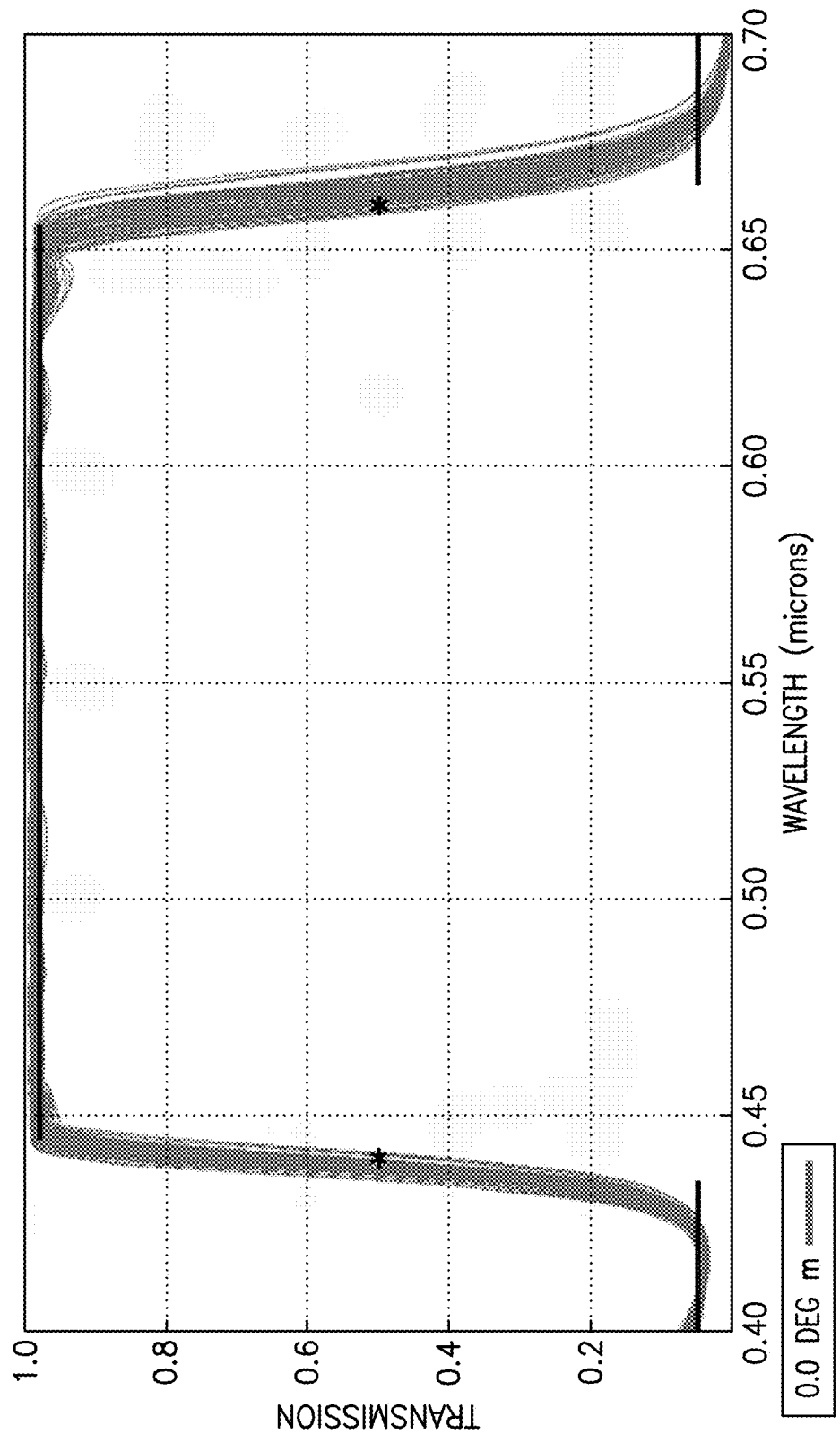
FIG. 8 is a graph plotting colour corrective AR with random and systematic errors.

A device and/or method for fabricating the embodiments, for example, a coating system, should preferably able to manufacture to tolerances of 1% random, and 0.5% systematic errors. Because of this tight demand, it is desirable that the embodiments are constructed using a highly accurate thickness control system, that may employ optical or quartz crystal monitoring. FIG. 8 shows a monitoring device with 1% random and 0.5% errors.

FIG. 9 is a plot overlaying a first trace of a filter without colour correction (dashed line), and a second trace of a filter with colour correction (solid line). Such a triple notch feature would likely be impractical, as it would have to be tailored individually to every reflector notch design.

Figure 10:
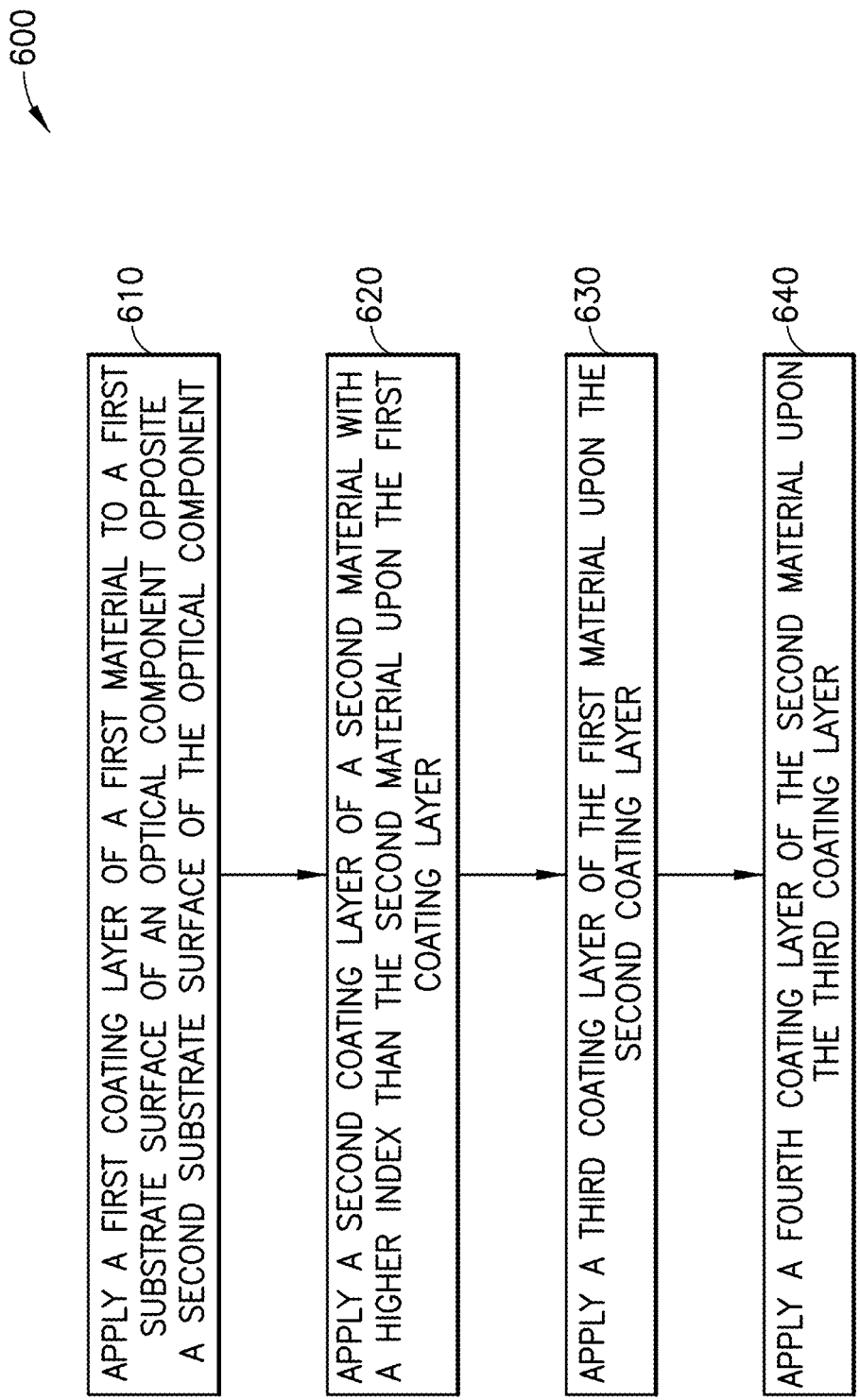
FIG. 10 is a flowchart of an exemplary embodiment of a process for forming an optical element with a colour corrective AR coating.

FIG. 10 is a flowchart 600 of an exemplary embodiment of a process for forming an optical element with a colour corrective AR coating. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A first coating layer of a first material is applied to a first substrate surface of an optical component opposite a second substrate surface of the optical component, as shown by block 610. A second coating layer of a second material with a higher index than the second material is applied upon the first coating layer, as shown by block 620. A third coating layer of the first material is applied upon the second coating layer, as shown by block 630. A fourth coating layer of the second material upon the third coating layer, as shown by block 640. While the method of FIG. 10 describes application of layers (two low index layers and two high index layers), in other embodiments there may be more or fewer layers.

Regarding the emission spectra of the light source, in order for the coated notch designs for the embodiments to be neutral, consideration of the emission spectra, or source of lighting, should be considered. For the examples discussed above, a typical daylight emission is represented by a black body curve at 5500K, which is appropriate for most combiner applications. However, depending where the device is to be used, the source of lighting may be different. For example, D65 sunlight is a black body emission spectra at 6500K. In this instance, it may be desirable for the colour corrective embodiments to be re-centred slightly to accommodate the different lighting conditions. Therefore, to accommodate different lighting conditions, the colour corrective cut off/cut on wavelengths may be adjusted accordingly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical element, comprising:
a first surface configured to convey light;
a second surface configured to convey light;
an optical path between the first surface and the second surface;
a filter coating applied to the first surface; and
a colour corrected anti-reflection (AR) coating comprising colour correcting and antireflection characteristics applied to the second surface, the coating configured according to
an antireflective function to maximise photopic transmission, or
integrated visual photopic transmission (IVPT) of the optical path, or
both,
wherein the second surface is disposed opposite the first surface, and the antireflective function is determined according to a daylight emission $I(\lambda)$, a transmission spectrum of the antireflection/colour corrective coating $T(\lambda)$ and a thickness $d(\lambda)$, of the film for a specified wavelength.

2. The optical element of claim 1, wherein the colour corrected AR coating comprises a first layer formed of a first material and a second layer formed of a second material, and the first material comprises a higher index than the second material.

3. The optical element of claim 1, wherein the photopic transmission is configured with a short cut off edge at 440 nm±10 nm and a long cutoff edge at 660±10 nm.

4. The optical element of claim 1, wherein the filter coating comprises a dichroic filter coating.

5. The optical element of claim 1, wherein the filter coating comprises a Rugate filter coating.

6. An optical device, comprising:
an optical element having a first surface and a second surface opposite the first surface;
a first coating applied to the first surface, wherein the first coating is configured to provide optical filtering; and
a second coating applied to the second surface, wherein the second coating is configured to provide anti-reflection and colour correction.

7. The optical device of claim 6, wherein the second coating is configured to provide a notch reflector.

8. The optical device of claim 7, wherein the notch reflector is a green notch reflector.

9. The optical device of claim 6, wherein the second coating exhibits a cut-on wavelength of 440 nm±10 nm.

10. The optical device of claim 6, wherein the second coating exhibits a cut-off wavelength of 660 nm±10 nm.

11. The optical device of claim 6, wherein the second coating comprises alternating layers comprising a first material having a first refractive index and a second material having a second refractive index less than the first refractive index.

12. The optical device of claim 11, wherein the first material is selected from the group consisting of TiO2, Ti3O5, Ta2O5, Nb2O5, and ZnS.

13. The optical device of claim 11, wherein the second material is selected from the group consisting of SiO2, Al$_2$O$_3$, YbF3, and YF3.

14. The optical device of claim 11, wherein the first refractive index is at least 2.

15. The optical device of claim 11, wherein the second refractive index is no more than 1.5.

16. The optical device of claim 11, wherein the alternating layers further comprise a third material having a third refractive index between the first refractive index and the second refractive index.

17. The optical device of claim 16, wherein the third material is in contact with a pair of layers of the second material.

18. The optical device of claim 6, wherein the second coating has a reflectance less than 0.5%.

19. The optical device of claim 6, wherein the optical element comprises a dichroic glass or a lens.

* * * * *